(12) United States Patent
Yandoc et al.

(10) Patent No.: US 11,728,179 B2
(45) Date of Patent: Aug. 15, 2023

(54) SURFACE MOUNT SEMICONDUCTOR DEVICE AND METHOD OF MANUFACTURE

(71) Applicant: NEXPERIA B.V., Nijmegen (NL)

(72) Inventors: Ricardo Yandoc, Hazel Grove (GB); Adam Richard Brown, Hazel Grove (GB); Haibo Fan, Nijmegen (NL); Kow Siew Ting, Nijmegen (NL); Nam Khong Then, Nijmegen (NL); Wei Leong Tan, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 162 days.

(21) Appl. No.: 16/111,470

(22) Filed: Aug. 24, 2018

(65) Prior Publication Data

US 2019/0067033 A1 Feb. 28, 2019

(30) Foreign Application Priority Data

Sep. 27, 2017 (EP) ..................................... 17193585

(51) Int. Cl.
| | |
|---|---|
| *H01L 23/49* | (2006.01) |
| *H01L 21/48* | (2006.01) |
| *H01L 21/56* | (2006.01) |
| *H01L 23/495* | (2006.01) |
| *H01L 23/31* | (2006.01) |

(52) U.S. Cl.
CPC ...... *H01L 21/4842* (2013.01); *H01L 21/4825* (2013.01); *H01L 21/4839* (2013.01); *H01L 21/565* (2013.01); *H01L 23/3107* (2013.01); *H01L 23/4952* (2013.01); *H01L 23/49503* (2013.01); *H01L 23/49541* (2013.01);

(Continued)

(58) Field of Classification Search
None
See application file for complete search history.

(56) References Cited

U.S. PATENT DOCUMENTS

| 9,978,668 B1* | 5/2018 | Villamor ............... H01L 21/561 |
| 2002/0004251 A1* | 1/2002 | Roberts ................. H01L 33/642 |
| | | 257/E33.059 |

(Continued)

FOREIGN PATENT DOCUMENTS

| EP | 0731505 A2 | 9/1996 |
| JP | S58106853 A | 6/1983 |
| JP | S59152654 A | 8/1984 |

OTHER PUBLICATIONS

European Search Report and Written Opinion for the corresponding application EP17193585, 7 pages, dated Mar. 9, 2018.

*Primary Examiner* — Bilkis Jahan
(74) *Attorney, Agent, or Firm* — Ruggiero, McAllister & McMahon LLC

(57) ABSTRACT

A surface mount semiconductor device and method of manufacture. A semiconductor die is mounted on a first support surface; a leadframe is attached to the semiconductor die, the leadframe comprising: an electrical lead having a first lead region connected to the semiconductor die; and a second lead region distal the first lead region, wherein the second lead region is connected to a second support surface; encapsulating the semiconductor die, first support surface and the first lead region; the second lead region is severed from the second support surface to expose a lead end; and the second lead region is electro-plated with a metallic material, such that the lead end is coated with said metallic material.

13 Claims, 8 Drawing Sheets

(52) U.S. Cl.
CPC .. *H01L 23/49548* (2013.01); *H01L 23/49562* (2013.01); *H01L 23/49582* (2013.01)

(56) References Cited

U.S. PATENT DOCUMENTS

| | | | | |
|---|---|---|---|---|
| 2006/0022298 | A1* | 2/2006 | Shiraishi | H01L 23/3107 |
| | | | | 257/509 |
| 2008/0073662 | A1* | 3/2008 | Wang | H01L 33/58 |
| | | | | 438/26 |
| 2009/0189264 | A1* | 7/2009 | Yato | H01L 23/49513 |
| | | | | 257/676 |
| 2010/0308448 | A1* | 12/2010 | Murakami | H01L 21/4821 |
| | | | | 257/676 |
| 2012/0025227 | A1* | 2/2012 | Chan | H01L 33/62 |
| | | | | 257/89 |
| 2014/0332939 | A1* | 11/2014 | Kuo | H01L 24/40 |
| | | | | 257/670 |
| 2015/0014829 | A1* | 1/2015 | Abbott | H01L 23/3107 |
| | | | | 438/123 |
| 2015/0311144 | A1* | 10/2015 | Williams | H01L 23/49513 |
| | | | | 438/122 |
| 2015/0380384 | A1* | 12/2015 | Williams | H01L 24/96 |
| | | | | 438/112 |
| 2016/0197030 | A1* | 7/2016 | Wong | H01L 21/4825 |
| | | | | 257/676 |
| 2016/0300784 | A1* | 10/2016 | Eugene Lee | H01L 21/78 |
| 2016/0307854 | A1* | 10/2016 | Matsubara | H01L 24/85 |
| 2017/0040183 | A1 | 2/2017 | Sakai | |
| 2019/0122965 | A1* | 4/2019 | Brown | H01L 23/49524 |
| 2021/0013135 | A1* | 1/2021 | Narayanasamy | H01L 21/56 |

* cited by examiner

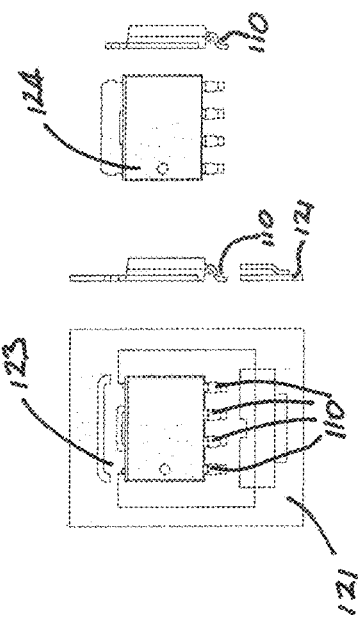
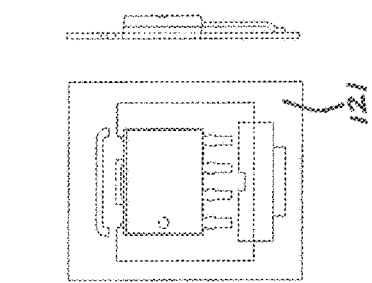
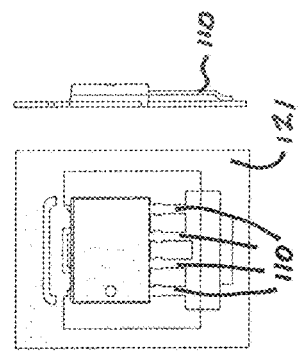
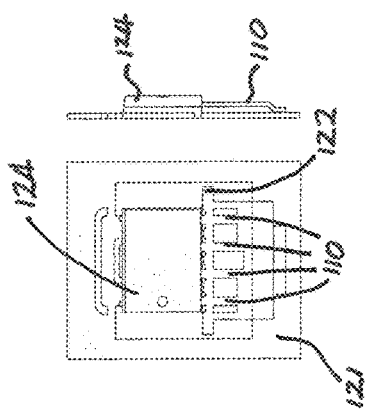

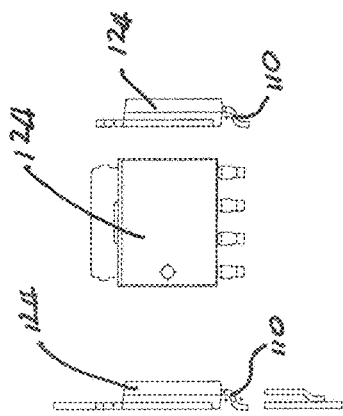
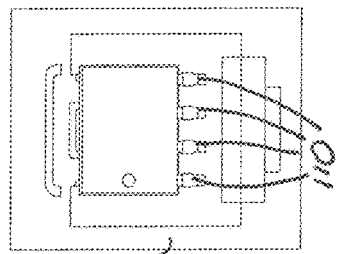
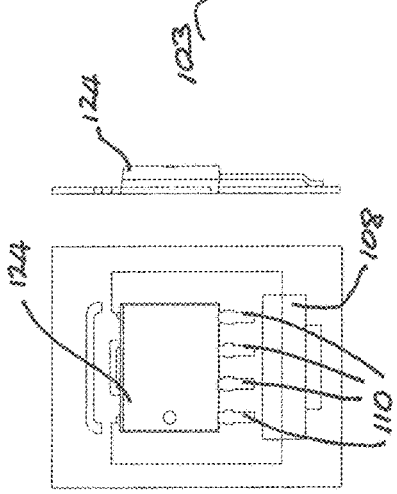
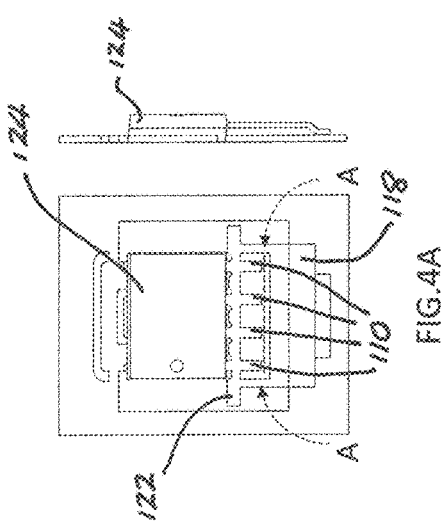

SURFACE MOUNT SEMICONDUCTOR DEVICE AND METHOD OF MANUFACTURE

CROSS REFERENCE TO RELATED APPLICATIONS

The present U.S. Patent Application claims foreign priority to European Patent Application 17193585.1, filed on Aug. 27, 2017, the entirety of which is incorporated by reference hereby.

FIELD

The present disclosure relates to a surface mount semiconductor device and to a method of manufacturing a surface mount semiconductor device.

DESCRIPTION OF THE RELATED ART

Semiconductor devices are capable of being mounted or placed directly onto the surface of a carrier such as a printed circuit board (PCB). Such semiconductor devices are called surface-mount devices (SMD). Using SMDs allows increased speed of producing completed electronic circuits formed on a PCB by using automated pick and place techniques thus reducing the manufacturing time of PCB mounted electronic circuits.

A PCB can normally comprise solder pads formed of tin-lead, silver, or gold plated copper pads onto which the corresponding leads of an SMD are mounted. A solder paste or a solder adhesive is first applied to the solder pads of the PCB. The SMD can then be placed on the PCB using a pick and place machine with the respective leads of the SMD being aligned with the respective solder pads of the PCB. Following placement of the SMD, a technique known as reflow is used to melt the solder paste and the leads of the SMD are electrically and mechanically bonded to the solder pads on the PCB. Surface tension of the molten solder helps to align the leads of the SMD on their respective pads.

However, due to inconsistencies in the solder pad formation on the PCB and/or lead geometry of the SMD, the amount of solder paste or adhesive placed on the pads, poor electrical or mechanical connections misalignment of the leads on the pads can result. The solder joint between the leads and PCB solder pads can become weak and crack or may be not be properly formed at all. Such weak or non-existent joints can result in reduced functionality of the electronic circuit mounted on the PCB and can result in a failure of the electronic circuit over time.

SMDs normally comprise a metal leadframe onto which the semiconductor die or chip is mounted. Prior to external electrical connections being made from the semiconductor die to respective leads of the leadframe, the leadframe will typically be plated, by an electroplating process, with a metallic material. Plating the leadframe facilitates electrical and mechanical connection of the semiconductor die to the lead frame. After mounting of the semiconductor die on a lead frame die pad, the assembly will undergo a moulding process where it will be encapsulated by a mould compound by an injection moulding process.

Following the injection moulding process, the exposed leads of the surface mount device can be plated with a metallic material such that the leads of the lead frame are also plated. Following plating of the exposed leads the surface mount device will undergo, amongst other processes lead cutting to separate surface mount device from the lead frame support, forming/shaping of the leads and then singulation. The singulated surface mount device can then be mounted on a carrier tape for shipping.

Cutting the leads and singulating the surface mount device results in lead end regions of the leads being unplated were the leads are cut from the plated leadframe. This can consequently result in poor formation of solder joints when the surface mount device is reflowed on the PCB because a solder fillet or joint is poorly formed because of the lack of plating at the lead ends.

A known process flow for forming surface mount devices is shown in FIGS. 1A to 1E. The process begins with FIG. 1A with an encapsulated semiconductor die mounted a die pad of the leadframe. For brevity, the mounting and encapsulation processes are not described as they are well known in the art. The terminals of the semiconductor die (not illustrated—obscured by the encapsulation 124) can be electrically connected to a plurality of leads 110, also known as clips, extending from one or more of the terminals of the semiconductor die (also not illustrated—obscured by the encapsulation 124). In addition to being connected to the terminals the leads extend to connect to an outer frame 121 of the lead frame. This connection of the leads 110 and by extension to the die pad ensures that the leads 110 and the die pad are supported by the outer frame 121 and that the leads are electrically connected the outer frame 121. This ensures electrical continuity with the outer frame 121 to enable electroplating of the leads 110. In the electro-plating process the metallic plating material can be considered as the anode and the outer frame 121, and thus by extension the leads outside the encapsulation, can be considered the cathode. A dambar 122 is connected across leads so that the leads are electrically shorted together. The dambar is arranged transversely across the leads where the leads enter the encapsulation to block (or dam) the flow of the encapsulation 124 to lead external lead areas during the encapsulation process. The leads 110, outer frame 121 and dambar 122 are then electro-plated with a metallic material.

As shown in FIGS. 1B and 1C, following electro-plating, the dambar 122 is removed and the leads 110 are severed from outer frame 121. Removal of the dambar 122 ensures that the leads are not shorted together. The leads 110 are severed from the outer frame 121 to allow the final geometry of the leads to be formed by bending or pressing the leads 110 as illustrated in FIG. 1D. As shown in FIG. 1D, a tab portion 123 can extend from the surface mount device to support the surface mount device on the outer frame 121 during lead processing. Final singulation of the surface mount device is shown in FIG. 1E whereby the tab portion 123 is severed from the outer frame 121 such that the surface mount device is ready for attachment to a carrier (not illustrated), such as tape or reel.

The skilled person will appreciate that whilst the Figures show a single surface mount device, such devices are typically processed in an array consisting of several hundreds or thousands of such devices. In order that the electroplating process can be completed simultaneously for each of the devices in the array, the outer frame 121 of each such arrangement must be connected to achieve electrical continuity. The step of singulation discussed above removes each individual device from the array.

The step of severing the leads 110, as described above with respect to FIG. 1C results in lead ends which are not plated.

SUMMARY

According to an embodiment a method of manufacturing a surface mount semiconductor device comprises mounting a semiconductor die on an a first support surface; attaching a leadframe to the semiconductor die, the leadframe comprising: an electrical lead having a first lead region connected to the semiconductor die; and a second lead region distal to the first lead region, wherein the second lead region is connected to a second support surface; encapsulating the semiconductor die, the first support surface and the first lead region; severing the second lead region from the second support surface to expose a lead end; and electro-plating the second lead region with a metallic material, such that the lead end is coated with said metallic material.

The second lead region can be coated with the metallic material and the first lead region is free from said metallic material.

The leadframe can further comprise a dambar connecting the second lead region to the second support surface.

Following electro-plating, the dambar can be severed from the second lead region.

The first support surface and the second support surface can be connected to a support frame.

Following severing of the dambar the first support surface can be severed from the support frame.

According to embodiments a surface mount semiconductor device comprises a semiconductor die mounted on an a first support surface; a leadframe attached to the semiconductor die, the leadframe comprising: an electrical lead having a first lead region connected to the semiconductor die; and a second lead region distal to the first lead region wherein the second lead region comprises a cross-sectional lead end; an encapsulation encasing the semiconductor die, the first support surface and the first lead region; wherein the cross-sectional lead end is electro-plated with a metallic material.

The second lead region can be plated with the metallic material and the first lead region can be free from the metallic material.

The leadframe can further comprise a dambar connecting the second lead region to a second support surface.

The first support surface and the second support surface can be connected to a support frame.

DESCRIPTION OF THE DRAWINGS

The invention is described further hereinafter by way of example only with reference to the accompanying drawings in which:

FIG. 1A shows a known example starting point for processing the leads of a surface mount device;

FIG. 1B shows a known example step of removing the dambar prior to plating of the leads;

FIG. 1C shows a known example step of severing the leads following plating;

FIG. 1D shows a known example step of forming the leads;

FIG. 1E shows a known example step of singulating the device from a support frame;

FIG. 4A illustrates an encapsulated semiconductor die with leads detached from a support tab in plan and side views according to an embodiment;

FIG. 4B illustrates plating and dam bar removal in plan and side views according to an embodiment;

FIG. 4C illustrates final lead formation in plan and side views according to an embodiment;

FIG. 4D illustrates singulation in plan and side view according to an embodiment.

In the figures and the following description and unless otherwise stated like reference numerals refer to like features.

Semiconductor device manufacture is made up of processes commonly referred to as front-end processing and back-end processes. Front-end processing comprises the wafer fabrication process where semiconductor chips or dies are formed are formed. Back-end processes can include formation of metal contacts on the semiconductor die and optionally can also include the assembly process where the final semiconductor devices are packaged.

Figure 2A:
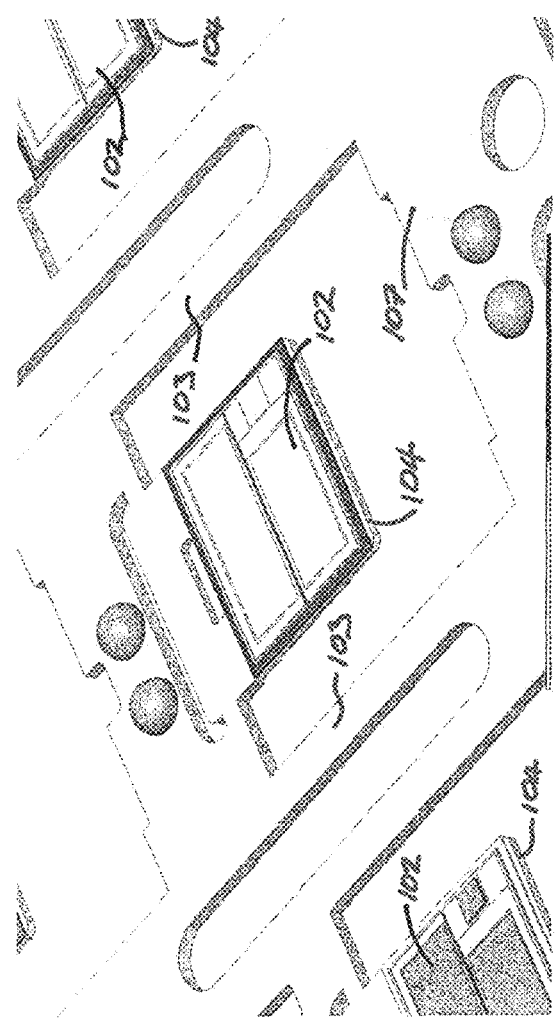
FIG. 2A illustrates a starting point for back-end assembly of a surface mount semiconductor device according to an embodiment.

FIG. 2A, illustrates a possible starting point for back-end assembly of a surface mount semiconductor device according to an embodiment. The semiconductor die 102 can be mounted and/or attached to a first support surface 104, such as a die attach pad. The support surface 104 can be supported by a metal frame 103, and support surface 104 and metal frame can be integrally formed of for example Cu. The semiconductor die 102 can be attached to the support surface 104 by any appropriate adhesive (not illustrated) such as an epoxy, or by an electrically conductive eutectic adhesive formed of for example an AgSn paste, AgSi paste, Ag paste, or PbSnAg or AgSn solder. Electrically conductive adhesives can be required where a surface of the semiconductor die 102 comprises a contact such as a backside metal contact of for example vertically conducting semiconductor dies, which should be both electrically and mechanically connected to the support surface 104. If no backside contact is present electrical and mechanical connection of the semiconductor die 102 to the support surface 104 may not be required, and the semiconductor die 102 can be bonded to the support surface 104 using an epoxy type adhesive. The support surface 104 can be formed of as repeating pattern, in a repeating pattern of metal frames 103 forming an array of such frames and support surfaces.

One or more semiconductor dies 102 can be mounted, as described above, on each support surface 104. The adhesive can be dispensed or printed on the first support surface 104. The semiconductor die 102 can be mounted using on the first support surface 104, by for example a pick and place process.

Figure 2B:
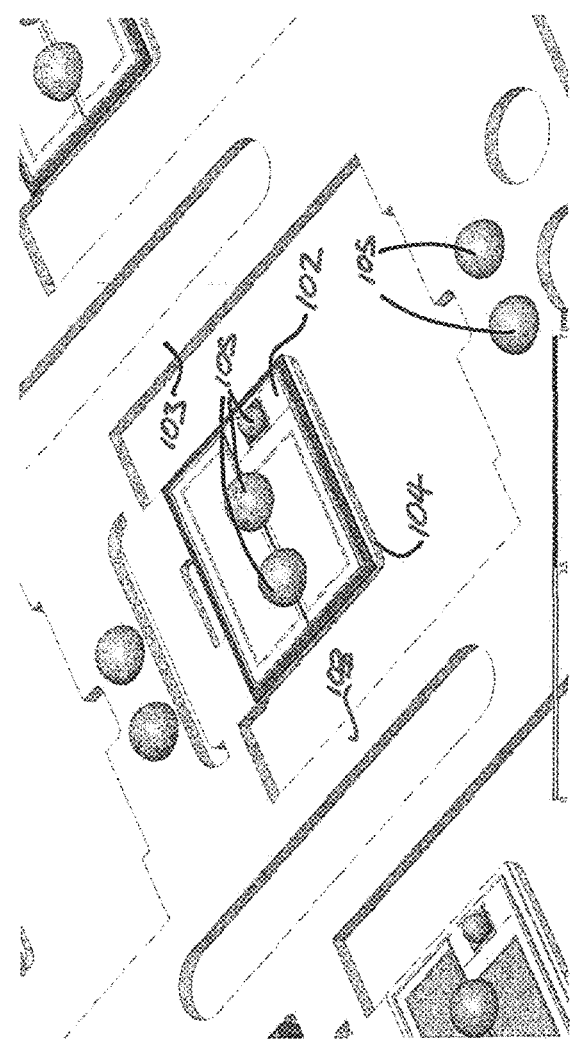
FIG. 2B illustrates a semiconductor die mounted on a die pad having a conductive adhesive material on the contacts.

As illustrated in FIG. 2B, a conductive adhesive material 105 can be deposited on contacts or terminals of the semiconductor die 102 and a second support surface 107 of the metal frame 103 for later connection of the electrical leads (as discussed below) to the semiconductor die 102 and the metal frame 103.

Figure 3A:
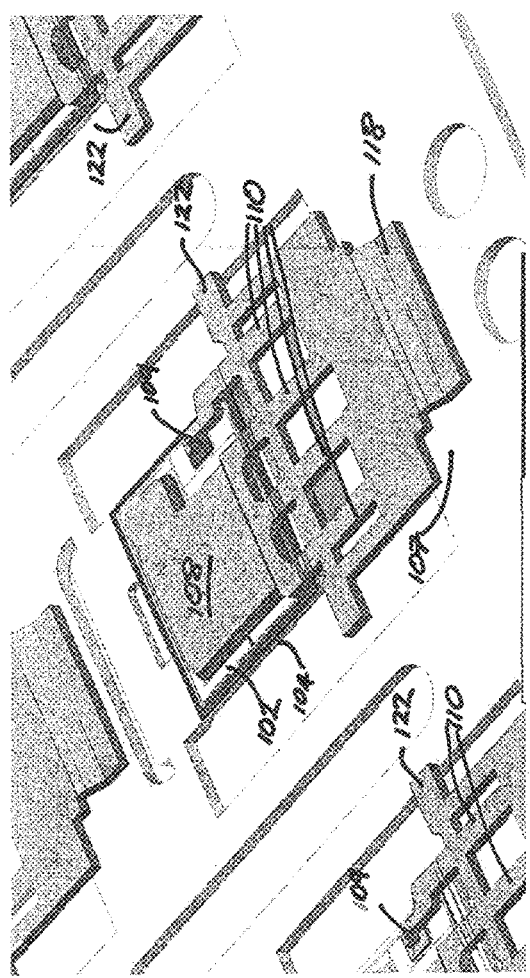
FIG. 3A illustrates a lead clip attached to a semiconductor die and support surface according to an embodiment.

The back-end assembly process can continue as illustrated in FIG. 3A whereby the so-called lead clip 106, or lead frame, of the semiconductor device is attached to the second support surface 107 of the metal frame 103 and to contacts of the semiconductor die 102. As mentioned with reference to FIG. 2B the lead clip 106 can be attached to the contacts of the semiconductor die using the electrically conductive material 105. The lead clip 106 is also attached to the second support surface 107 using the electrically conductive adhesive material 105 formed thereon.

The conductive adhesive material 105 can then be dispensed on the contacts of the semiconductor die 102 and the second support surface 107 and as illustrated in FIG. 3A. The lead the clip 106 can then be attached using the conductive adhesive material 105. Where the conductive adhesive material 105 is a solder material, a reflow process can be used to cure the solder.

Figure 3B:
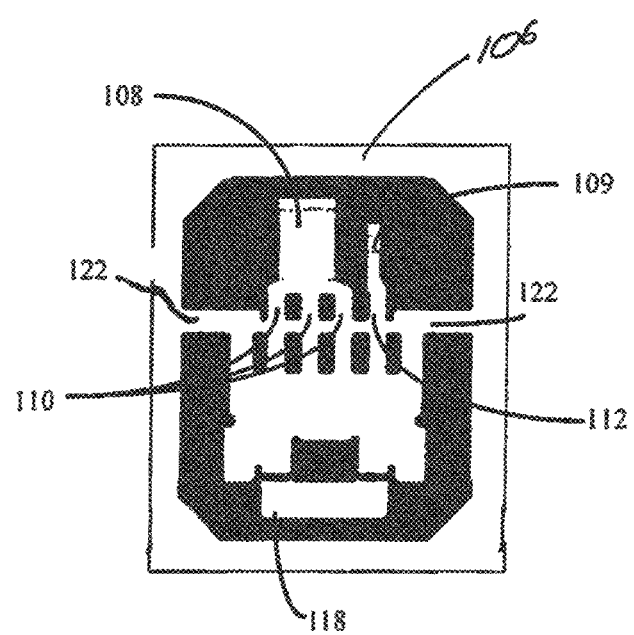
FIG. 3B illustrates a lead clip according to an embodiment.

For ease of understanding the lead clip 106 according to an embodiment is illustrated in FIG. 3B. The lead clip 106 can be formed of any appropriate material such as Cu or CuFe, and can comprise one or more contact portions 108, 109, or first lead regions, for contacting to the conductive adhesive material 105 formed on the contacts of the semiconductor die 102. Lead portions 110, 112 can extend from and be integrally formed with the contact portions 108, 109, such that the lead portions can be considered an extension of the contact portions 108, 109. The lead clip 106 can be coated with for example a NiPd material, or any other suitable metallic coating.

The lead portions 110, 112 form a second lead end, or second lead region, and ultimately form the external leads of the surface mount semiconductor device. Additionally, the lead clip 106 can comprise a further attachment tab 118, or support tab, which can be fixed to the leadframe using conductive adhesive material 105 formed on the second support surface 107.

The contact portions 108, 109 of the lead clip 106, can form electrical and mechanical connections to a corresponding contacts or terminals of the semiconductor die 102. In this way, the contact portions 108, 109 by way of mechanical pressure serve to further secure the semiconductor die on the support surface 104, whilst also forming the electrical connections from the metal contacts of the semiconductor die to the lead portions 110 and ultimately the external leads of the surface mount semiconductor device.

The lead clip 106, can also include a so-called dambar 122 which connects to and extends transversely across, the lead portions 110 forming the second lead ends, or second lead regions, so as to mechanically connect and electrically short the lead portions 110. During subsequent plastic moulding or encapsulating of the surface mount semiconductor device, as discussed below with reference to FIG. 3C below, the dam bar 122 prevents, limits, or dams the flow of moulding encapsulation material to the lead portions 110 during the encapsulation process, to prevent so-called mould flashing onto areas of the leads outside of the encapsulation. The dambar 122 can also serve to prevent distortion of the leads during initial manufacturing of the lead clip 106. Optionally, and not illustrated, the dambar can be electrically and mechanically connected to the metal frame 103 using any appropriate means, such as a conductive adhesive or solder material as discussed above.

Figure 3C:
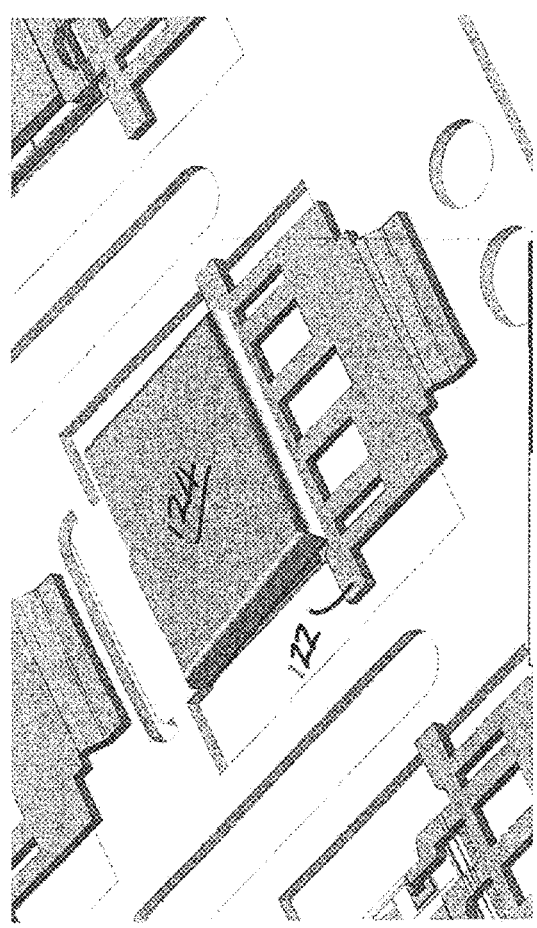
FIG. 3C illustrates an encapsulated semiconductor die according to an embodiment.

FIG. 3C shows the encapsulation 124 formed on the lead frame, clip portion and semiconductor die and terminating at the dam bar 122. Encapsulation or moulding processes are well known in the art of semiconductor manufacturing and will not be described in further detail.

Following encapsulation, the semiconductor device will undergo plating, dam bar cutting, lead forming and device singulation as illustrated in FIGS. 4A to 4D.

As illustrated in FIG. 4A, and prior to electroplating process, the lead portions 110 forming will but cut or severed from the further attachment tab 118 as indicated by line A-A. This defines the final lead size and exposes the lead end for plating. In the case where the lead clip 106 is coated with NiPd, cross-section of the lead severed from the further tab will no longer contain such NiPd coating because this coating occurred prior to the step of severing.

In an alternative embodiment, the lead portions can be formed such that they do not directly contact the further attachment tab 118 and thus do not require severing from the further attachment tab 118. Instead, the leads can be formed with exposed lead ends and connection to the further attachment tab 118, and thus to the support frame, can be made via the dam bar. The plating process can be carried out by any suitable electroplating process and the plating material can be a metallic material, such as for example Sn.

The step of severing or providing exposed lead ends defines a cross-sectional portion or end face of the lead that is capable of being plated with the metallic material.

From the foregoing discussion the skilled person will realise that through use of an electroplating process the entire lead portion, including the portion or end face of the lead end formed following severing from the further tab will be plated with the metallic material. This is because the dam bar connection to the metal frame maintains electrical continuity across the all the lead portions during plating such that the ends of the leads portions will also be plated. This results in a plated lead portion, including lead end, and dam bar. The skilled person will appreciate that the portion or end face of the lead end is that portion of the lead which is capable of being whetted by the solder or solder paste for connection of the surface mount semiconductor device to the corresponding connection pads of a carrier, such as a PCB.

Following the plating process and as illustrated in FIG. 4B, the dambars can be trimmed from the leads to ensure that the lead portions are not shorted in the completed semiconductor device. This results in un-plated side areas of the lead portions. Furthermore, because the contact portions 108, 109, or first lead ends are encased in the encapsulation they will remain un-plated and free from any plating material, except for any prior coating material applied, such as NiPd as discussed above.

The next stage of the process is final lead formation as illustrated in FIG. 4C and the associated side view. At this stage of the process the plated leads are mechanically pressed or bent to define their desired geometry. The surface mount semiconductor device is then separated from the support surface 103 by a process known as singulation as illustrated in FIG. 4D and the completed device, is ready for packaging on for example a carrier tape.

Optionally, the back end process can include a final stage whereby the semiconductor device or devices are mounted on a carrier such as, for example a PCB using a pick and place machine. In addition, following mounting of the semiconductor device on the carrier an Automatic Optical Inspection (AOI) can be carried out to check and verify that each of the individual semiconductor devices are mounted in the correct position on the carrier and the solder joints between the leads ends and solder pads of the carrier are formed correctly.

Figure 5:
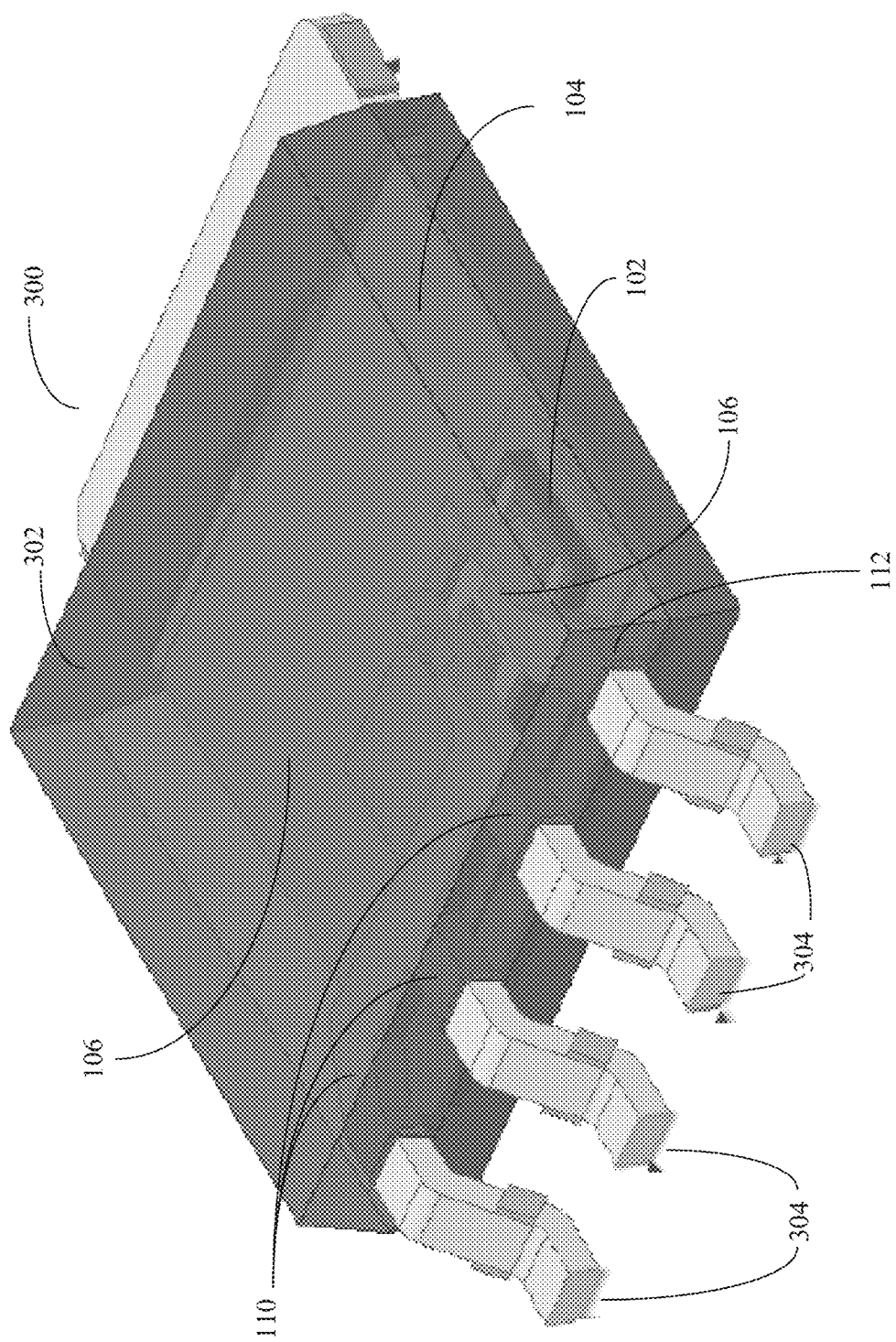
FIG. 5 illustrates a singulated surface mount semiconductor device according to an embodiment.

FIG. 5 illustrates a completed surface mount semiconductor device in accordance with an embodiment. The semiconductor device 300 comprises a semiconductor die 102 mounted on a first support surface 104, such as a die attach pad. The first support surface 104 can be formed of any appropriate material, such as for example copper. The semiconductor die 102 can be mounted to the first support surface 104 using any suitable adhesive. Electrical connections in the form of a lead clip 106 are electrically and mechanically connected to terminals (not illustrated), such as anode and cathode terminals, of the semiconductor die 102 A plurality of digitated or finger like lead portions 110 bifurcate from the clip portions to form the external leads of the semiconductor device 300.

The semiconductor die 102, the lead clip 106 and portions of the leads 110 and joining the lead clip 106 are embedded within an encapsulation material 124 and potions of the leads 110 distal to the clip 106 are not embedded in the encapsulation. Therefore potions of the leads 110 will be embedded in the encapsulation and portions of the leads will be outside the encapsulation. As a result of the manufacturing process discussed above, whereby the leads are plated following encapsulation, the portions of the leads embedded in the encapsulation will be free from any plating material, whereas portions of the leads outside the encapsulation will be plated, except for the portions of the leads where the dam bar has been removed.

As illustrated in FIG. 5, the portion of the leads outside the encapsulation are plated with plating material including lead end faces 304. Following the process discussed above, the lead-end faces are the extreme end portions of the leads outside the encapsulation formed to allow solderable connections to the contact pads of a PCB. The lead end faces follow the cross-section of the leads and in this case are shown as rectilinear in cross-section, however, the skilled person will appreciate that other cross-sectional shapes are possible, dependent on the geometry of the lead.

The embodiments discussed above can be implemented in various semiconductor package types, such as power transistors or diode products formed as LFPAK (Loss Free Packaging), QFN (Quad Flat No-leads), DFN (Dual-Flat No-Leads) or TO220. In addition embodiments can also be applied to Integrated Circuit products such as SOIC (Small Outline Integrated Circuits) or DIPP (dual in-line pin package).

Particular aspects of the invention are set out in the accompanying independent claims. Combinations of features from the dependent and/or independent claims can be combined as appropriate and not merely as set out in the claims.

The scope of the present disclosure includes any novel feature or combination of features disclosed therein either explicitly or implicitly or any generalization thereof irrespective of whether or not it relates to the claimed invention or mitigate against any or all of the problems addressed by the present invention. The applicant hereby gives notice that new claims can be formulated to such features during prosecution of this application or of any such further application derived there from. In particular, with reference to the appended claims, features from dependent claims can be combined with those of the independent claims and features from respective independent claims can be combined in any appropriate manner and not merely in specific combinations enumerated in the claims.

Features which are described in the context of separate embodiments can also be provided in combination in a single embodiment. Conversely, various features which are, for brevity, described in the context of a single embodiment, can also be provided separately or in any suitable sub combination.

Term "comprising" does not exclude other elements or steps, the term "a" or "an" does not exclude a plurality. Reference signs in the claims shall not be construed as limiting the scope of the claims.

The invention claimed is:

1. A method of manufacturing a surface mount semiconductor device, the method comprising:
    mounting a semiconductor die on a first support surface;
    clip-attaching a leadframe to the semiconductor die, the leadframe comprising:
        a lead clip for the surface mount semiconductor device comprising an electrical lead finally shaped to surface mount the semiconductor device, the electrical lead having a first lead region formed on and connected to the contacts of semiconductor die; and a second lead region distal to the first lead region, wherein the second lead region is connected to a second support surface;
    encapsulating the semiconductor die, the first support surface and the first lead region;
    severing the second lead region from the second support surface to expose a lead end; and
    electro-plating the second lead region with a metallic material, such that an exposed cross-sectional lead end face of the exposed lead end is coated with the metallic material.

2. The method according to claim 1, wherein the second lead region is coated with the metallic material and the first lead region is free from the metallic material.

3. The method according to claims 1, wherein the lead end is a cross-sectional end face of the second lead region.

4. The method according to claim 1, wherein the leadframe further comprises a dambar for electrical connection of the second lead region to the second support surface.

5. The method according to claims 4, wherein following the electro-plating, the dambar is severed from the second lead region.

6. The method according to claims 5, wherein the first support surface and the second support surface are connected to a support frame.

7. The method according to claims 6, wherein following severing of the dambar the first support surface is severed from the support frame.

8. A surface mount semiconductor device comprising:
    a semiconductor die mounted on a first support surface;
    a leadframe that is clip-attached to the semiconductor die, the leadframe comprising:
        a lead clip for the surface mount semiconductor device comprising an electrical lead finally shaped to surface mount the semiconductor device, the electrical lead having a first lead region formed on and connected to the contacts of the semiconductor die; and a second lead region distal to the first lead region wherein the second lead region comprises an exposed cross-sectional lead end face electroplated with a metallic material; and
    an encapsulation encasing the semiconductor die, the first support surface and the first lead region.

9. The surface mount semiconductor device according to claim 8, wherein the second lead region is plated with the metallic material and the first lead region is free from the metallic material.

10. The surface mount semiconductor device according to claim 8, wherein the leadframe further comprises a dam bar connecting the second lead region to a second support surface.

11. The surface mount semiconductor device according to claim 10, wherein the first support surface and the second support surface are connected to a support frame.

12. The surface mount semiconductor device according to claim 8, wherein the exposed cross-sectional lead end includes an electro-plated lead end face at an extreme end portion of the second lead region.

13. The surface mount semiconductor device according to claim 8, wherein the entire exposed cross-sectional lead end is electro-plated with the metallic material.

\* \* \* \* \*